US011694747B2

(12) United States Patent
Yang et al.

(10) Patent No.: US 11,694,747 B2
(45) Date of Patent: Jul. 4, 2023

(54) SELF-SELECTING MEMORY CELLS CONFIGURED TO STORE MORE THAN ONE BIT PER MEMORY CELL

(71) Applicant: Micron Technology, Inc., Boise, ID (US)

(72) Inventors: Lingming Yang, Meridian, ID (US); Xuan Anh Tran, Irvine, CA (US); Karthik Sarpatwari, Boise, ID (US); Francesco Douglas Verna-Ketel, Boise, ID (US); Jessica Chen, Boise, ID (US); Nevil N. Gajera, Meridian, ID (US); Amitava Majumdar, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/337,806

(22) Filed: Jun. 3, 2021

(65) Prior Publication Data

US 2022/0392526 A1 Dec. 8, 2022

(51) Int. Cl.
*G11C 13/00* (2006.01)
*G11C 11/56* (2006.01)

(52) U.S. Cl.
CPC ...... *G11C 11/5678* (2013.01); *G11C 13/0004* (2013.01); *G11C 13/0026* (2013.01); *G11C 13/0028* (2013.01); *G11C 13/0069* (2013.01); *G11C 2013/0092* (2013.01)

(58) Field of Classification Search
CPC ........... G11C 11/5678; G11C 13/0004; G11C 13/0026; G11C 13/0028; G11C 13/0069; G11C 2013/0092
See application file for complete search history.

(56) References Cited

U.S. PATENT DOCUMENTS

| 6,084,795 A * | 7/2000 | Nunokawa ......... G11C 11/5657 365/168 |
| 6,091,621 A * | 7/2000 | Wang ................. G11C 11/5657 365/65 |
| 7,864,567 B2 | 1/2011 | Gordon et al. |
| 8,406,058 B2 | 3/2013 | Wu et al. |
| 9,099,174 B2 | 8/2015 | Calderoni et al. |

(Continued)

OTHER PUBLICATIONS

Title: Multi-Step Pre-Read for Write Operations in Memory Devices, U.S. Appl. No. 17/154,644, filed Jan. 21, 2021, Inventors: Yen Chun Lee et al., Status: Publications—Issue Fee Payment Verified, Status Date: May 18, 2022.

(Continued)

*Primary Examiner* — Khamdan N. Alrobaie
(74) *Attorney, Agent, or Firm* — Greenberg Traurig

(57) ABSTRACT

Systems, methods and apparatus to program a memory cell to have a threshold voltage to a level representative of one value among more than two predetermined values. A first voltage pulse is driven across the memory cell to cause a predetermined current to go through the memory cell. The first voltage pulse is sufficient to program the memory cell to a level representative of a first value. To program the memory cell to a level representative of a second value, a second voltage pulse, different from the first voltage pulse, is driven across the memory cell within a time period of residual poling in the memory cell caused by the first voltage pulse.

19 Claims, 6 Drawing Sheets

(56) References Cited

U.S. PATENT DOCUMENTS

| | | |
|---|---|---|
| 9,275,730 B2 | 3/2016 | Tortorelli et al. |
| 9,613,691 B2 | 4/2017 | Mantegazza et al. |
| 10,431,301 B2 | 10/2019 | Mirichigni et al. |
| 10,566,052 B2 | 2/2020 | Mirichigni et al. |
| 10,755,781 B2 | 8/2020 | Robustelli |
| 10,950,315 B1 | 3/2021 | Jeon et al. |
| 11,024,347 B2 | 6/2021 | Bringivijayaraghavan et al. |
| 11,139,034 B1 | 10/2021 | Sarpatwari et al. |
| 11,238,945 B1 | 2/2022 | Di Vincenzo |
| 11,295,822 B2 | 4/2022 | Sarpatwari et al. |
| 11,367,484 B1 | 6/2022 | Lee et al. |
| 11,404,130 B1 | 8/2022 | Gajera et al. |
| 2005/0226034 A1 | 10/2005 | Pemer |
| 2007/0237016 A1* | 10/2007 | Miyamoto ............. G11C 11/22 365/222 |
| 2009/0027961 A1 | 1/2009 | Park et al. |
| 2009/0207645 A1 | 8/2009 | Parkinson |
| 2011/0019495 A1 | 1/2011 | Scheuerlein et al. |
| 2011/0182109 A1 | 7/2011 | Ikeda et al. |
| 2012/0275210 A1 | 11/2012 | Yan et al. |
| 2016/0125952 A1 | 5/2016 | Hu et al. |
| 2017/0125097 A1 | 5/2017 | Tortorelli et al. |
| 2017/0309341 A1 | 10/2017 | Eldredge et al. |
| 2018/0040370 A1 | 2/2018 | Tortorelli et al. |
| 2019/0189206 A1 | 6/2019 | Tortorelli et al. |
| 2019/0341112 A1 | 11/2019 | Castro |
| 2020/0066343 A1 | 2/2020 | Castro et al. |
| 2021/0011769 A1 | 1/2021 | Xie et al. |
| 2021/0125656 A1 | 4/2021 | Muller |
| 2021/0201995 A1 | 7/2021 | Castro et al. |
| 2021/0202018 A1 | 7/2021 | Hirst et al. |
| 2021/0312976 A1 | 10/2021 | Pellizzer et al. |
| 2021/0336132 A1* | 10/2021 | Lee ....................... H01L 45/146 |
| 2022/0013167 A1 | 1/2022 | Robustelli et al. |
| 2022/0013183 A1 | 1/2022 | Sarpatwari et al. |
| 2022/0068391 A1 | 3/2022 | Tortorelli et al. |
| 2022/0284957 A1 | 9/2022 | Lee et al. |

OTHER PUBLICATIONS

Title: Multi-Step Pre-Read for Write Operations in Memory Devices, U.S. Appl. No.: 17/824,776, filed, Inventors: Yen Chun Lee et al., Status: Application Undergoing Preexam Processing, Status Date: May 25, 2022.

Title: Programming Intermediate State to Store Data in Self-Selecting Memory Cells, U.S. Appl. No. 17/336,913, filed Jun. 2, 2021, Inventors: Karthik Sarpatwari et al., Status: Docketed New Case—Ready for Examination, Status Date: Aug. 23, 2021.

International Search Report and Written Opinion, PCT/US2022/029498, dated Aug. 30, 2022.

International Search Report and Written Opinion, PCT/US2022/029497, dated Sep. 1, 2022.

Title: Multi-Step Pre-Read for Write Operations in Memory Devices, U.S. Appl. No. 17/154,644, filed Jan. 21, 2021, Inventors: Yen Chun Lee et al., Status: Application Dispatched from Preexam, Not Yet Docketed, Status Date: Feb. 25, 2021.

Title: Programming Intermediate State to Store Data in Self-Selecting Memory Cells, U.S. Appl. No. 17/336,913, filed Jun. 2, 2021, Inventors: Karthik Sarpatwari et al., Status: Application Undergoing Preexam Processing, Status Date: Jun. 2, 2021.

* cited by examiner

SELF-SELECTING MEMORY CELLS CONFIGURED TO STORE MORE THAN ONE BIT PER MEMORY CELL

TECHNICAL FIELD

At least some embodiments disclosed herein relate to memory systems in general and, more particularly but not limited to, techniques of configuring memory cells to store data.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

A memory device can include a memory integrated circuit having one or more arrays of memory cells formed on an integrated circuit die of semiconducting material. A memory cell is a smallest unit of memory that can be individually used or operated upon to store data. In general, a memory cell can store one or more bits of data.

Different types of memory cells have been developed for memory integrated circuits, such as random access memory (RAM), read-only memory (ROM), dynamic random access memory (DRAM), static random access memory (SRAM), synchronous dynamic random access memory (SDRAM), phase change memory (PCM), magneto random access memory (MRAM), negative-or (NOR) flash memory, electrically erasable programmable read-only memory (EEPROM), flash memory, etc.

Some integrated circuit memory cells are volatile and require power to maintain data stored in the cells. Examples of volatile memory include Dynamic Random-Access Memory (DRAM) and Static Random-Access Memory (SRAM).

Some integrated circuit memory cells are non-volatile and can retain stored data even when not powered. Examples of non-volatile memory include flash memory, Read-Only Memory (ROM), Programmable Read-Only Memory (PROM), Erasable Programmable Read-Only Memory (EPROM) and Electronically Erasable Programmable Read-Only Memory (EEPROM) memory, etc. Flash memory includes negative-and (NAND) type flash memory or a negative-or (NOR) type flash memory. A NAND memory cell is based on a NAND logic gate; and a NOR memory cell is based on a NOR logic gate.

Cross-point memory (e.g., 3D XPoint memory) uses an array of non-volatile memory cells. The memory cells in cross-point memory are transistor-less. Each of such memory cells can have a selector device and optionally a phase-change memory device that are stacked together as a column in an integrated circuit. Memory cells of such columns are connected in the integrated circuit via two layers of wires running in directions that are perpendicular to each other. One of the two layers is above the memory cells; and the other layer is below the memory cells. Thus, each memory cell can be individually selected at a cross point of two wires running in different directions in two layers. Cross point memory devices are fast and non-volatile and can be used as a unified memory pool for processing and storage.

A non-volatile integrated circuit memory cell can be programmed to store data by applying a voltage or a pattern of voltage to the memory cell during a program/write operation. The program/write operation sets the memory cell in a state that corresponds to the data being programmed/stored into the memory cell. The data stored in the memory cell can be retrieved in a read operation by examining the state of the memory cell. The read operation determines the state of the memory cell by applying a voltage and determining whether the memory cell becomes conductive at a voltage corresponding to a pre-defined state.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
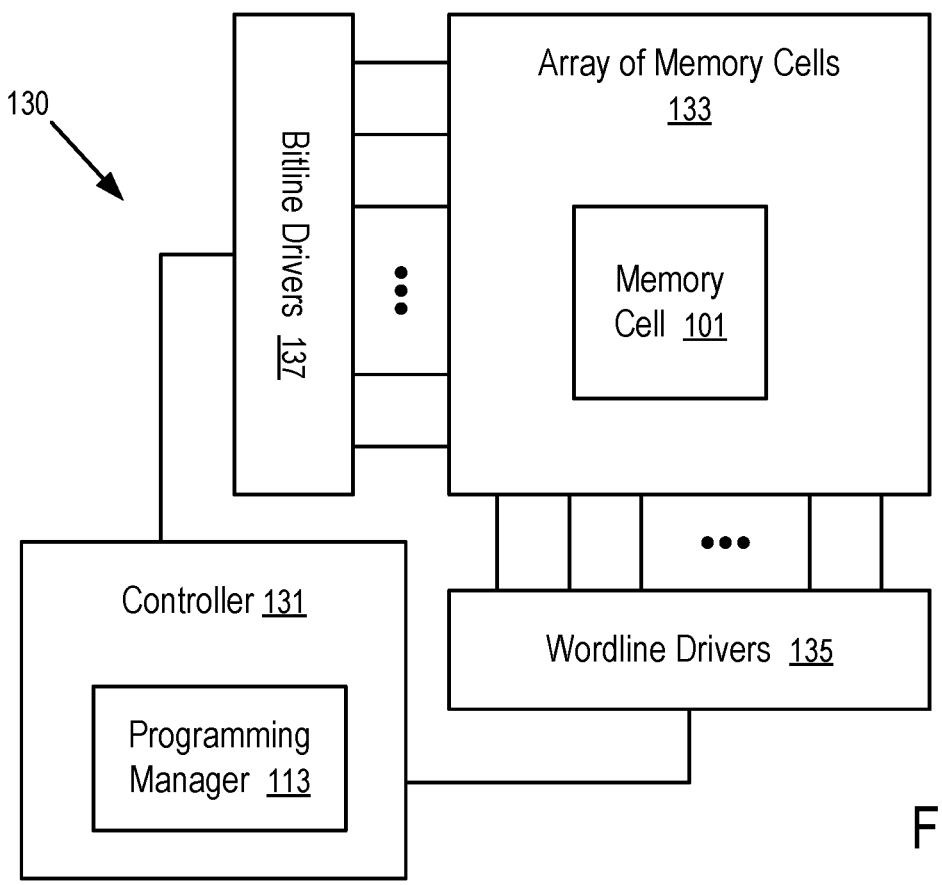
FIG. 1 shows a memory device configured with a programming manager according to one embodiment.

At least some aspects of the present disclosure are directed to a memory sub-system configured to program the threshold voltage of a self-selecting memory cell to an alternative voltage region by applying a voltage pulse to modulate residual poling in the memory cell resulting from an initial voltage pulse configured to program the threshold voltage to an initial voltage region. The technique can be used to program the memory cell to store more than one bit of data.

The memory sub-system can be used as a storage device and/or a memory module. Examples of storage devices, memory modules, and memory devices are described below in conjunction with FIG. 15. A host system can utilize a memory sub-system that includes one or more components, such as memory devices that store data. The host system can provide data to be stored at the memory sub-system and can request data to be retrieved from the memory sub-system.

An integrated circuit memory cell, such as a memory cell in a flash memory or a memory cell in a cross-point memory, can be programmed to store data by the way of its state at a voltage applied across the memory cell.

For example, if a memory cell is configured or programmed in such a state that allows a substantial current to pass the memory cell at a voltage in a predefined voltage region, the memory cell is considered to have been configured or programmed to store a first bit value (e.g., one or zero); and otherwise, the memory cell is storing a second bit value (e.g., zero or one).

Optionally, a memory cell can be configured or programmed to store more than one bit of data by being configured or programmed to have a threshold voltage in one of more than two separate voltage regions.

The threshold voltage of a memory cell is such that when the voltage applied across the memory cell is increased to above the threshold voltage, the memory cell changes rapidly or abruptly, snaps, or jumps from a non-conductive state to a conductive state. The non-conductive state allows a small leak current to go through the memory cell; and in contrast, the conductive state allows more than a threshold amount of current to go through. Thus, a memory device can use a sensor to detect the change, or determine the conductive/non-conductive state of the memory device at one or more applied voltages, to evaluate or classify the level of the threshold voltage of the memory cell and thus its stored data.

The threshold voltage of a memory cell being configured/ programmed to be in different voltage regions can be used to represent different data values stored in the memory cell. For example, the threshold voltage of the memory cell can be programmed to be in any of four predefined voltage regions; and each of the regions can be used to represent the bit values of a different two-bit data item. Thus, when given a two-bit data item, one of the four voltage regions can be selected based on a mapping between two-bit data items and voltage regions; and the threshold voltage of the memory cell can be adjusted, programmed, or configured to be in the selected voltage region to represent or store the given two-bit data item. To retrieve, determine, or read the data item from the memory cell, one or more read voltages can be applied across the memory cell to determine which of the four voltage regions contain the threshold voltage of the memory cell. The identification of the voltage region that contains the threshold voltage of the memory cell provides the two-bit data item that has been stored, programmed, or written into the memory cell.

For example, a memory cell can be configured or programmed to store a one-bit data item in a Single Level Cell (SLC) mode, or a two-bit data item in a Multi-Level Cell (MLC) mode, or a three-bit data item in a Triple Level Cell (TLC) mode, or a four-bit data item in Quad-Level Cell (QLC) mode, or a five-bit data item in a Penta-Level Cell (PLC) mode.

The threshold voltage of a memory cell can change or drift over a period of time, usage, and/or read operations, and in response to certain environmental factors, such as temperate changes. The rate of change or drift can increase as the memory cell ages. The change or drift can result in errors in determining, retrieving, or reading the data item back from the memory cell.

Random errors in reading memory cells can be detected and corrected using redundant information. Data to be stored into memory cells can be encoded to include redundant information to facilitate error detection and recovery. When data encoded with redundant information is stored in a memory sub-system, the memory sub-system can detect errors in data represented by the voltage regions of the threshold voltages of the memory cells and/or recover the original data that is used to generate the data used to program the threshold voltages of the memory cells. The recovery operation can be successful (or have a high probability of success) when the data represented by the threshold voltages of the memory cells and thus retrieved directly from the memory cells in the memory sub-system contains fewer errors, or the bit error rate in the retrieved data is low and/or when the amount of redundant information is high. For example, error detection and data recovery can be performed using techniques such as Error Correction Code (ECC), Low-Density Parity-Check (LDPC) code, etc.

It is a challenge to efficiently program the threshold voltage of a memory cell into a voltage region to represent a value, separate from other voltage regions representing other values, especially when the memory cell is configured to store more than one bit of data. To store more than one bit of date per memory cell, the threshold voltage of a memory cell is to be programmed to one of more than two voltage regions. It is relatively easier to program the threshold voltage of a memory cell to some voltage regions that are determined primarily by the polarity of the voltage pulse and the level of current passing through the memory cell. It is more difficult to program the threshold voltage of the memory cell to other voltage regions.

At least some aspects of the present disclosure address the above and other deficiencies and/or challenges by modulation of residual poling of an initial voltage pulse, configured to program the threshold voltage into an initial voltage region representing one value, to move the threshold voltage of the memory cell to an alternative voltage region representing another value.

The initial voltage pulse can be applied to move the threshold voltage of the memory cell into the initial voltage region determined primarily by the polarity of the initial voltage pulse and the current passing through the memory cell during the initial voltage pulse. Residual poling can occur within the memory cell during a short period of time after the initial voltage applied across the memory cell is reduced such that the memory cell is in a non-conductive state. A short voltage pulse can be applied during the period of residual poling to reliably move the threshold voltage of the memory cell into an alternative voltage region to represent a different value, as further discussed below.

FIG. 1 shows a memory device 130 configured with a programming manager 113 according to one embodiment.

In FIG. 1, the memory device 130 includes an array 133 of memory cells, such as a memory cell 101. An array 133 can be referred to as a tile; and a memory device (e.g., 130) can have one or more tiles. Different tiles can be operated in parallel in a memory device (e.g., 130).

For example, the memory device 130 illustrated in FIG. 1 can have a cross-point memory having at least the array 133 of memory cells (e.g., 101).

In some implementations, the cross point memory uses a memory cell 101 that has an element (e.g., a sole element) acting both as a selector device and a memory device. For example, the memory cell 101 can use a single piece of alloy with variable threshold capability. The read/write operations of such a memory cell 101 can be based on thresholding the memory cell 101 while inhibiting other cells in sub-threshold bias, in a way similar to the read/write operations for a memory cell having a first element acting as a selector device and a second element acting as a phase-change memory device that are stacked together as a column. A selector device usable to store information can be referred to as a selector/memory device.

The memory device 130 of FIG. 1 includes a controller 131 that operates bitline drivers 137 and wordline drivers 135 to access the individual memory cells (e.g., 101) in the array 133.

Figure 2:
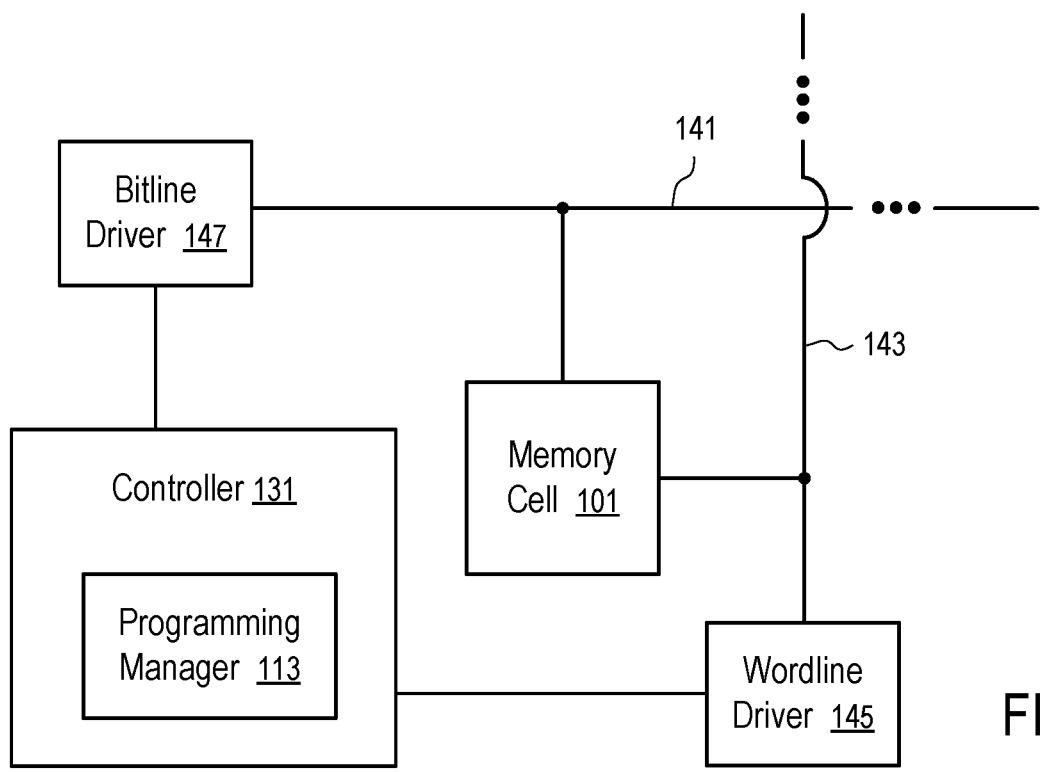
FIG. 2 shows a memory cell with a bitline driver and a wordline driver configured to apply voltage pulses according to one embodiment.

For example, each memory cell (e.g., 101) in the array 133 can be accessed via voltages driven by a pair of a bitline driver 147 and a wordline driver 145, as illustrated in FIG. 2.

The controller 131 includes a programming manager 113 configured to implement residual poling modulation. The programming manager 113 can be implemented, for example, via logic circuits and/or microcodes/instructions. For example, to program the threshold voltage of the memory cell 101 into a second voltage region adjacent to a first voltage region, the programming manager 113 can instruct the bitline drivers 137 and the wordline drivers 135 to initially apply a voltage pulse usable to program the threshold voltage of the memory cell 101 into the first voltage region. Upon the completion of the initial voltage pulse and during the residual poling period associated with the initial voltage pulse, the programming manager 113 further instructs the bitline drivers 137 and the wordline drivers 135 to apply a short voltage pulse to move the threshold voltage of the memory cell 101 from the first voltage region to the adjacent second voltage region that is based on but separate from the first voltage region, and determined primarily based on one or more aspects of the short voltage pulse.

FIG. 2 shows a memory cell 101 with a bitline driver 147 and a wordline driver 145 configured to apply voltage pulses according to one embodiment. For example, the memory cell 101 can be a typical memory cell 101 in the memory cell array 133 of FIG. 1.

The bitline driver 147 and the wordline driver 145 of FIG. 2 are controlled by the programming manager 113 of the controller 131 to selectively apply one or more voltages pulses to the memory cell 101.

The bitline driver 147 and the wordline driver 145 can apply voltages of different polarities on the memory cell 101.

For example, in applying one polarity of voltage (e.g., positive polarity), the bitline driver 147 drives a positive voltage relative to the ground on a bitline 141 connected to a row of memory cells in the array 133; and the wordline driver 145 drives a negative voltage relative to the ground on a wordline 143 connected to a column of memory cells in the array 133.

In applying the opposite polarity of voltage (e.g., negative polarity), the bitline driver 147 drives a negative voltage on the bitline 141; and the wordline driver 145 drives a positive voltage on the wordline 143.

The memory cell 101 is in both the row connected to the bitline 141 and the column connected to the wordline 143. Thus, the memory cell 101 is subjected to the voltage difference between the voltage driven by the bitline driver 147 on the bitline 141 and the voltage driven by the wordline driver 145 on the wordline 143.

In general, when the voltage driven by the bitline driver 147 is higher than the voltage driven by the wordline driver 145, the memory cell 101 is subjected to a voltage in one polarity (e.g., positive polarity); and when the voltage driven by the bitline driver 147 is lower than the voltage driven by the wordline driver 145, the memory cell 101 is subjected to a voltage in the opposite polarity (e.g., negative polarity).

In some implementations, the memory cell 101 is a self-selecting memory cell implemented using a selector/memory device. The selector/memory device has a chalcogenide (e.g., chalcogenide material and/or chalcogenide alloy). For example, the chalcogenide material can include a chalcogenide glass such as, for example, an alloy of selenium (Se), tellurium (Te), arsenic (As), antimony (Sb), carbon (C), germanium (Ge), and silicon (Si). A chalcogenide material can primarily have selenium (Se), arsenic (As), and germanium (Ge) and be referred to as SAG-alloy. SAG-alloy can include silicon (Si) and be referred to as SiSAG-alloy. In some embodiments, the chalcogenide glass can include additional elements such as hydrogen (H), oxygen (O), nitrogen (N), chlorine (Cl), or fluorine (F), each in atomic or molecular forms. The selector/memory device has a top side and a bottom side. A top electrode is formed on the top side of the selector/memory device for connecting to a bitline 141; and a bottom electrode is formed on the bottom side of the selector/memory device for connecting to a wordline 143. For example, the top and bottom electrodes can be formed of a carbon material. For example, a chalcogenide material of the memory cell 101 can take the form of a crystalline atomic configuration or an amorphous atomic configuration. The threshold voltage of the memory cell 101 can be dependent on the ratio of the material in the crystalline configuration and the material of the amorphous configuration in the memory cell 101. The ratio can change under various conditions (e.g., having currents of different magnitudes and directions going through the memory cell 101).

A self-selecting memory cell 101, having a selector/memory device, can be programmed to have a threshold voltage window. The threshold voltage window can be created by applying programming pulses with opposite polarity to the selector/memory device. For example, the memory cell 101 can be biased to have a positive voltage difference between two sides of the selector/memory device and alternatively, or to have a negative voltage difference between the same two sides of the selector/memory device. When the positive voltage difference is considered in positive polarity, the negative voltage difference is considered in negative polarity that is opposite to the positive polarity. Reading can be performed with a given/fixed polarity. When programmed, the memory cell has a low threshold (e.g., lower than the cell that has been reset, or a cell that has been programmed to have a high threshold), such that during a read operation, the read voltage can cause a programmed cell to snap and thus become conductive while a reset cell remains non-conductive.

For example, to program the voltage threshold of the memory cell 101, the bitline driver 147 and the wordline driver 145 can drive a pulse of voltage onto the memory cell 101 in one polarity (e.g., positive polarity) to snap the memory cell 101 such that the memory cell 101 is in a conductive state. While the memory cell 101 is conductive, the bitline driver 147 and the wordline driver 145 continue driving the programming pulse to change the threshold voltage of the memory cell 101 towards a voltage region that represents the data or bit value(s) to be stored in the memory cell 101.

The controller 131 can be configured in an integrated circuit having a plurality of decks of memory cells. Each deck can be sandwiched between a layer of bitlines, a layer of wordlines; and the memory cells in the deck can be arranged in an array 133. A deck can have one or more arrays or tiles. Adjacent decks of memory cells may share a layer of bitlines (e.g., 141) or a layer of wordlines (e.g., 143).

Bitlines are arranged to run in parallel in their layer in one direction; and the wordlines are arranged to run in parallel in their layer in another direction orthogonal to the direction of the bitlines. Each of the bitlines is connected to a row of memory cells in the array; and each of the wordlines is connected to a column of memory cells in the array. Bitline drivers 137 are connected to bitlines in the decks; and wordline drivers 135 are connected to wordlines in the decks. Thus, a typical memory cell 101 is connected to a bitline driver 147 and a wordline driver 145.

The threshold voltage of a typically memory cell 101 is configured to be sufficiently high such that when only one of its bitline driver 147 and wordline driver 145 drives a voltage in either polarity while the other voltage driver holds the respective line to the ground, the magnitude of the voltage applied across the memory cell 101 is insufficient to cause the memory cell 101 to become conductive. Thus, addressing the memory cell 101 can be performed via both of its bitline driver 147 and wordline driver 145 driving a voltage in opposite polarity relative to the ground for operating/selecting the memory cell 101. Other memory cells connected to the same wordline driver 145 can be de-selected by their respective bitline drivers holding the respective bitlines to the ground; and other memory cells connected to the same bitline driver can be de-selected by their respective wordline drives holding the respective wordlines to the ground.

A group of memory cells (e.g., 101) connected to a common wordline driver 145 can be selected for parallel operation by their respective bitline drivers (e.g., 147) driving up the magnitude of voltages in one polarity while the wordline driver 145 is also driving up the magnitude of a voltage in the opposite polarity. Similarly, a group of memory cells connected to a common bitline driver 147 can be selected for parallel operation by their respective wordline drivers (e.g., 145) driving voltages in one polarity while the bitline driver 147 is also driving a voltage in the opposite polarity.

At least some examples are disclosed herein in reference to a cross-point memory having self-selecting memory cells. Other types of memory cells and/or memory having similar threshold voltage characteristics can also be used. For example, memory cells each having a selector device and a phase-change memory device and/or flash memory cells can also be used in at least some embodiments.

Figure 3:
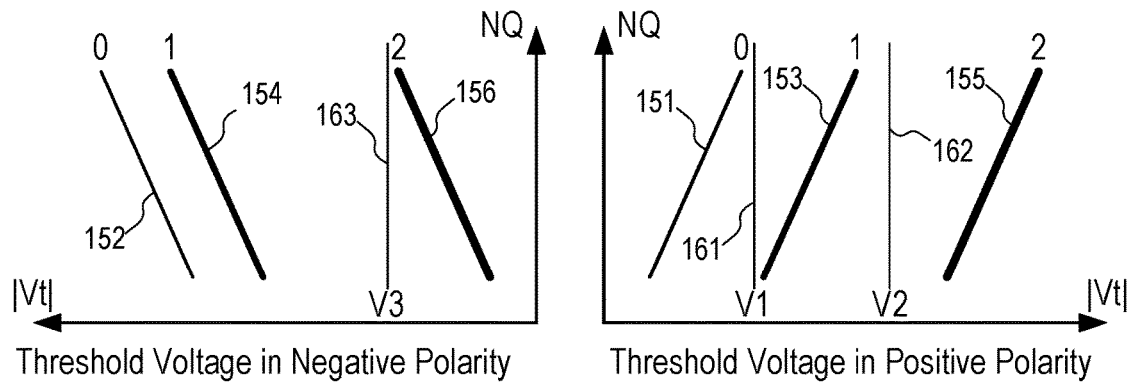
FIG. 3 illustrates distributions of threshold voltages of memory cells each configured to represent one of three predetermined values according to one embodiment.

FIG. 3 illustrates distributions of threshold voltages of memory cells each configured to represent one of three predetermined values according to one embodiment. For example, the programming manager 113 of FIGS. 1 and 2 can be used to program the threshold voltage of a memory cell 101 such that the probability distribution of its threshold voltage is as illustrated in FIG. 3.

Figure 8:
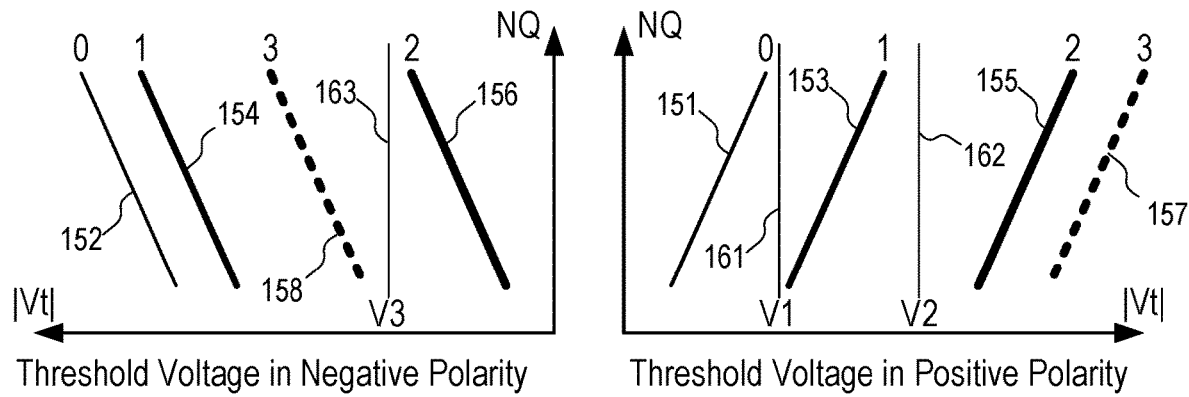
FIG. 8 illustrates distributions of threshold voltages of memory cells each configured to represent one of four predetermined values according to one embodiment.

The probability distribution of the threshold voltage of a memory cell can be illustrated via a normal quantile (NQ) plot, as in FIGS. 3 and 8. When a probability distribution (e.g., 151) of threshold voltage programmed in a region is a normal distribution (also known as Gaussian distribution), its normal quantile (NQ) plot is seen as aligned on a straight line (e.g., distribution 151).

A self-selecting memory cell (e.g., 101) can have a threshold voltage in negative polarity and a threshold voltage in positive polarity. When a voltage applied on the memory cell 101 in either polarity is increased in magnitude up to its threshold voltage in the corresponding polarity, the memory cell (e.g., 101) snaps from a non-conductive state to a conductive state.

The threshold voltage of a memory cell 101 in negative polarity and the threshold voltage of the memory cell 101 in positive polarity can have different magnitudes. Memory cells programmed to have large magnitudes in threshold voltages in positive polarity can have small magnitudes in threshold voltages in negative polarity; and memory cells programmed to have small magnitudes in threshold voltages in positive polarity can have large magnitudes in threshold voltages in negative polarity.

Figures 4, 5, 6:
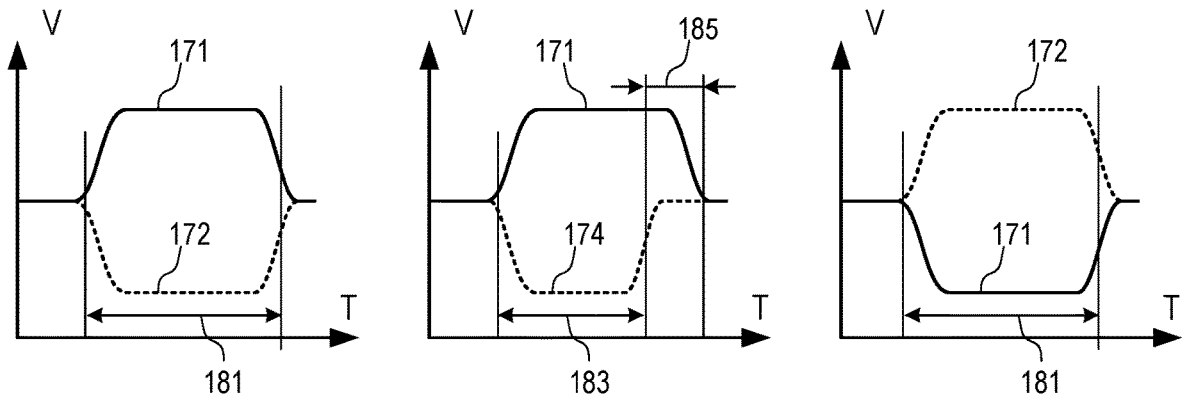
FIGS. 4 to 6 illustrate voltage pulses applied to configure memory cells to each store one of three predetermined values according to one embodiment.

For example, a memory cell 101 can be programmed to have a small magnitude in threshold voltage according to distribution 151 in the positive polarity to represent a value (e.g., zero); and as a result, its threshold voltage has a large magnitude according to distribution 152 in the negative polarity to represent the same value (e.g., zero). The threshold voltages of the memory cell 101 in the positive and negative polarities can be programmed to the distributions 151 and 152 by applying a voltage pulse in the positive polarity (e.g., as illustrated in FIG. 4) to place the memory cell 101 in a conductive state and to cause a predetermined level of current (e.g., 120 μA) to go through the memory cell 101.

Alternatively, the memory cell 101 can be programmed to have a large magnitude in threshold voltage according to distribution 155 in the positive polarity to represent another value (e.g., two); and as a result, its threshold voltage has a smaller magnitude according to distribution 156 in the negative polarity to represent the same value (e.g., two). The threshold voltages of the memory cell 101 in the positive and negative polarities can be programmed to the distributions 155 and 156 by applying a voltage pulse in the negative polarity (e.g., as illustrated in FIG. 6) to place the memory cell 101 in a conductive state and to cause a predetermined level of current (e.g., 120 μA) to go through the memory cell 101.

Alternatively, the memory cell 101 can be programmed to have a medium magnitude in threshold voltage according to distribution 153 in the positive polarity to represent a further value (e.g., one); and as a result, its threshold voltage has a magnitude according to distribution 154 in the negative polarity to represent the same value (e.g., one). The threshold voltages of the memory cell 101 in the positive and negative polarities can be programmed to the distributions 153 and 154 by modulating residual poling of a voltage pulse (e.g., FIG. 4) used to program the threshold voltage of the memory cell 101 to the distributions 151 and 152, or a voltage pulse (e.g., FIG. 6) used to program the threshold voltage of the memory cell 101 to the distributions 155 and 156. For example, the modulation of residual poling can be implemented using a voltage profile illustrated in FIG. 5, as discussed further below.

In FIG. 3, the voltage distributions 151, 153 and 155 in the positive polarity are separated by read voltage V1 161 and read voltage V2 162. Thus, whether the threshold voltage of the memory cell 101 in the positive polarity is in the distribution 151 can be determined by testing whether the memory cell 101 is conductive at the read voltage V1 161 in the positive polarity; and whether the threshold voltage of the memory cell 101 in the positive polarity is in the distribution 155 can be determined by testing whether the memory cell 101 is non-conductive at the read voltage V2 162 in the positive polarity. If the threshold voltage of the memory cell 101 in the positive polarity is in neither the distribution 151 nor the distribution 155, it is in the distribution 153 representative of the corresponding value (e.g., one).

Also, in FIG. 3, the distribution 156 is separated from the distributions 152 and 154 in the negative polarity by the read voltage V3 163. Thus, a determination of whether the threshold voltage of the memory cell 101 in the positive polarity is in the distribution 155 can be determined by testing whether the memory cell 101 is conductive at the read voltage V3 163 in the negative polarity.

FIGS. 4 to 6 illustrate voltage pulses applied to configure memory cells to each store one of three predetermined values according to one embodiment.

FIGS. 4 to 6 show, as a function of time T, a bitline voltage 172 or 174 driven by a bitline driver 147 on to a bitline 141 connected to a memory cell 101 and a wordline voltage 171 driven by a wordline driver 145 on to a wordline 143 connected to the memory cell 101.

When the bitline driver 147 and the wordline driver 145 drive a same voltage (e.g., ground) on the bitline 141 and the wordline 143 respectively, the voltage difference applied across the memory cell 101 is zero.

In FIG. 4, the wordline voltage 171 is higher than the bitline voltage 172 during the time period 181 of a voltage pulse. Thus, the voltage difference across the memory cell 101 is in one polarity (e.g., positive); and the magnitude of the voltage difference between the wordline voltage 171 and the bitline voltage 172 is configured to be sufficiently high to cause the memory cell 101 to snap into the conductive state. The voltage pulse during the time period 181 has a duration sufficient to bring the current passing through the memory cell 101 to reach a predetermined level (e.g., 120 µA). After the current reaches the predetermined level, the voltage difference across the memory cell 101 can be removed. As a result, the threshold voltage of the memory cell 101 in the positive polarity is in the distribution 151 illustrated in FIG. 3; and the threshold voltage of the memory cell 101 in the negative polarity is in the distribution 152 illustrated in FIG. 3. After the current reaches the predetermined level in the time period 181, the length of the duration in which the current is maintained at the level has no significant impact on the threshold voltages of the memory cell 101. The predetermined level of current is configured such that after the current reaches the predetermined level in the time period 181, the current does not change significantly as the application of the voltage difference across the memory cell 101 continues for a period of time.

In FIG. 6, the wordline voltage 171 is lower than the bitline voltage 172 during the time period 181 of a voltage pulse. Thus, the voltage difference across the memory cell 101 is in another polarity (e.g., negative); and the magnitude of the voltage difference between the wordline voltage 171 and the bitline voltage 172 is configured to be sufficiently high to cause the memory cell 101 to snap into the conductive state. The voltage pulse during the time period 181 has a duration sufficient to bring the current passing through the memory cell 101 to reach a predetermined level (e.g., 120 µA). After the current reaches the predetermined level, the voltage difference across the memory cell 101 can be removed. As a result, the threshold voltage of the memory cell 101 in the negative polarity is in the distribution 156 illustrated in FIG. 3; and the threshold voltage of the memory cell 101 in the positive polarity is in the distribution 151 illustrated in FIG. 3. After the current reaches the predetermined level in the time period 181, the length of the duration in which the current is maintained at the level has no significant impact on the threshold voltages of the memory cell 101. The predetermined level is configured such that after the current reaches the predetermined level in the time period 181, the current does not change significantly as the application of the voltage difference across the memory cell 101 continues for a period of time.

FIG. 5 illustrates a configuration of the wordline voltage 171 and the bitline voltage 174 during the time period 183 of an initial voltage pulse that is similar to the voltage pulse of the time period 181 in FIG. 4. During the time period 183 of the initial voltage pulse, the memory cell 101 becomes conductive and reaches a current at a predetermined level (e.g., 120 µA) as under the voltage pulse in FIG. 4. When the bitline voltage 174 changes to reduce the magnitude of the voltage difference applied across the memory cell 101 at the end of the time period 183, the memory cell 101 becomes non-conductive.

When the initial voltage pulse is applied on the memory cell 101 in the time period 183, there is an electric field built up within the memory cell 101 to resist the applied voltage pulse. When the memory cell 101 becomes non-conductive, the effect of the electric field (e.g., residual poling) dissipates over a short period of time. In the short time period following the end of the time period 183, residual poling caused by the voltage pulse applied during the time period 183 can be modulated using a short voltage pulse (e.g., less than 20 nanoseconds) to cause a significantly change the threshold voltage of the memory cell 101.

In FIG. 5, a short voltage pulse or bias is applied in the time period 185 by maintaining and/or extending the voltage level driven by the bitline driver 147 on the bitline 141. Without the voltage pulse of bias of the time period 185, the thresholds of the memory cell 101 would be programmed into the distributions 151 and 152, as with the application of the voltage pulse of FIG. 4. The voltage pulse of bias of the time period 185 modulates the residual poling in the memory cell 101 to move the threshold voltages of the memory cell 101 to distributions 153 and 154 illustrated in FIG. 3. When the memory cell 101 is programmed according to FIG. 5, the memory cell 101 can have an intermediate third state represented by the distributions 153 and 154 that are configured between a first state represented by the distributions 151 and 152, and a second state presented by the distributions 155 and 156. Such a technique enables the memory device 130 to efficiently program a memory cell to store one of three different values (and thus more than one bit per memory cell).

FIG. 5 illustrates an example of applying a voltage pulse or bias to modulate the residual poling of the voltage pulse of FIG. 4. Alternatively, a voltage pulse or bias can be applied to modulate the residual poling of the voltage pulse of FIG. 6 (e.g., by reversing the polarity of the wordline voltage 171 and the bitline voltage 174 in FIG. 5).

FIG. 5 illustrates an example of applying a positive voltage pulse or bias by changing the bitline voltage 174 at the end of time period 183 sooner than changing the wordline voltage 171. Alternatively, a negative voltage pulse or bias can be applied to residual poling by the wordline driver 145 changing from driving a high voltage to driving the ground sooner than the bitline driver 147 makes the corresponding change.

The effect of the pulse during the time period 181 in FIGS. 4 and 6 and time period 183 in FIG. 5 is primarily controlled by the voltage polarity and the current at the end of the time period 181 or 183 but is not sensitive to the length of the time period 181 or 183. Thus, the durations of the programming pulses can be configured to have a same length for programming using the pulses illustrated in FIGS. 4 to 6. For example, the length of time period 181 of FIG. 4 can be equal to the sum of the length of the time periods 183 and 185 of FIG. 5; the length of time period 181 of FIG. 6 can be equal to the sum of the length of the time periods 183 and 185 of FIG. 5; and/or the length of time period 181 of FIG. 4 can be equal to the length of time period 181 of FIG. 6.

When the memory cell 101 is configured to store more than one bit per memory cell (e.g., using a threshold distribution programmed to use the technique of FIG. 5), the gaps between some of the distributions (e.g., 151 and 153, 153 and 155) can be small. Further, the distributions can drift over a period of time and/or usage. To reliably read the values of the memory cells, a set of memory cells programmed together according to a data pattern can be read to dynamically determine the read voltages (e.g., V1 and V2) using a technique of FIG. 7.

Figure 7:
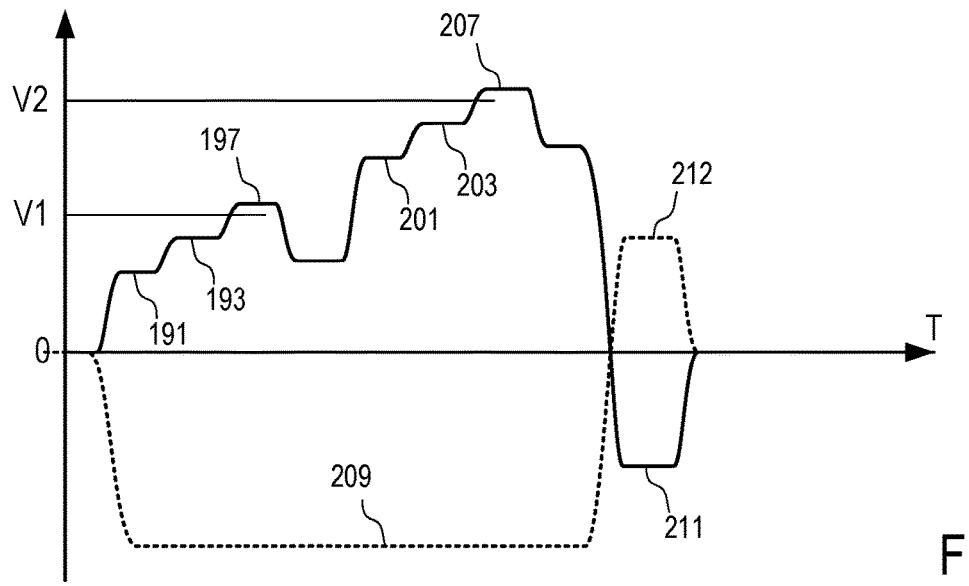
FIG. 7 illustrates voltages driven by a bitline driver and a wordline driver to read the value stored by a memory cell programmed to store one of three predetermined values according to one embodiment.

FIG. 7 illustrates voltages driven by a bitline driver 147 and a wordline driver 145 to read the value stored by a memory cell 101 programmed to store one of three predetermined values according to one embodiment. For example, the technique of FIG. 7 can be used to read a memory cell programmed using one of the voltage pulses of FIGS. 4 to 6 to have distributions representative one of three values illustrated in FIG. 3.

In FIG. 7, the bitline driver 147 drives a negative voltage level 209 during a time period in which the wordline driver 145 drives a positive voltage ranging from voltage level 191 to voltage level 207.

To determine the optimal read voltage V1, the wordline driver 145 increases its voltage level in small increments. When the voltage level 191 is applied by the wordline driver 145, the controller 131 of the memory device determines whether data as identified by the states of a set of memory cells, including the memory cell 101, satisfies a pattern. For example, the set of memory cells can store data encoded in a way such that when the read voltage V1 separating the distribution 151 and 153 is applied, the number of memory cells having the conductive state among the set of memory cells reaches a known count, or a known percentage. In FIG. 7, the pattern is not satisfied at the voltage level 191; and thus, the wordline driver 145 increases its voltage to the next voltage level 193. The process repeats until, when the voltage level 197 is reached, the pattern is satisfied by the results represented by the conductive/non-conductive states of the memory cells in the set. Thus, whether the memory cell 101 is programmed to the distribution 151 under the read voltage V1 is determined based on whether the memory cell 101 is conductive at the voltage level 197 driven by the wordline driver 145.

Similarly, the wordline driver 145 can step up from voltage level 201, to voltage level 203, etc., until the voltage level 207 is found such that the count of memory cells that become conductive within the set of memory cells satisfies a known pattern (e.g., equals to a known number or percentage).

In FIG. 7, after the determination of whether the memory cell 101 is programmed to the low magnitude distribution 151, the medium magnitude distribution 153, or the high magnitude distribution 155, the wordline driver 145 and the bitline driver 147 can reverse their polarity to drive the setback levels 211 and 212, which provide a voltage pulse configured to recover the intermediate state represented by the distribution 153, if the memory cell 101 is programmed to the medium magnitude distribution 153.

FIG. 7 illustrates an example of the wordline driver 145 stepping up voltage levels 191 to 207 while the bitline driver 147 driving a substantially constant level 209. Alternatively, the wordline driver 145 can drive a constant level while the bitline driver 147 steps up voltage levels to count memory cells that become conductive.

FIG. 8 illustrates distributions of threshold voltages of memory cells each configured to represent one of four predetermined values according to one embodiment. For example, the programming manager 113 of FIGS. 1 and 2 can be used to program the threshold voltage of a memory cell 101 such that the probability distribution of its threshold voltage is as illustrated in FIG. 8.

FIGS. 9 to 12 illustrate voltage pulses applied to configure memory cells to each store one of four predetermined values according to one embodiment.

Figure 9:
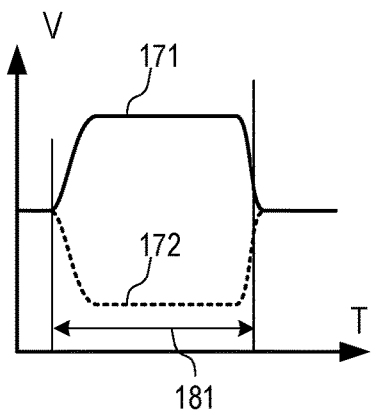
FIGS. 9 to 12 illustrate voltage pulses applied to configure memory cells to each store one of four predetermined values according to one embodiment.
Figure 10:
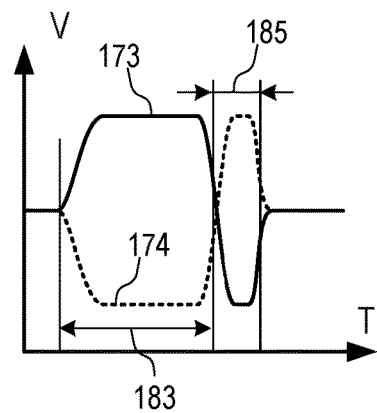
Figure 11:
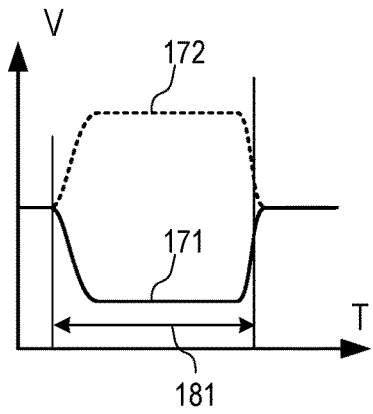
Figure 12:
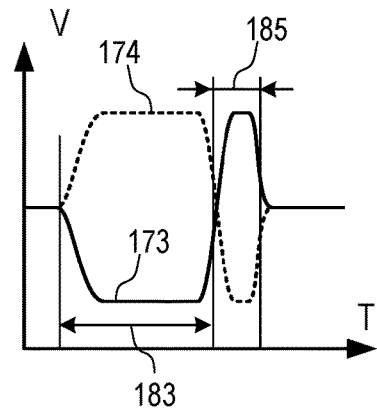

For example, in the positive polarity, the threshold voltage of the memory cell 101 can be programmed using the voltages of FIG. 9 to the distribution 151 to represent a first value (e.g., zero), or to the distribution 153 to represent a second value (e.g., one) using the voltages of FIG. 10, or to the distribution 155 to represent a third value (e.g., two) using the voltages of FIG. 11, or to the distribution 157 to represent a fourth value (e.g., three) using the voltages of FIG. 12.

In the negative polarity, the threshold voltage of the memory cell 101 can be programmed using the voltages of FIG. 9 to the distribution 152 to represent the first value (e.g., zero), or to the distribution 154 to represent the second value (e.g., one) using the voltages of FIG. 10, or to the distribution 156 to represent the third value (e.g., two) using the voltages of FIG. 11, or to the distribution 158 to represent the fourth value (e.g., three) using the voltages of FIG. 12.

The voltage pulses of FIGS. 9 and 11 in the time period 181 are similar to those in FIGS. 4 and 6 to push the threshold voltage of the memory cell 101 to the distributions 151 and 155 in the positive polarity and the distributions 152 and 156 in the negative polarity. The resulting distributions 151, 155, 152 and 156 are determined primarily by the polarity of the voltage difference applied across the memory cell 101 during the time period 181 and the current passing through the memory cell 101 at the end of the time period 181.

The wordline voltage 173 and the bitline voltage 174 shown in FIG. 10 have an initial time period 183 that is configured in a way similar to the voltages 171 and 172 of FIG. 9 in polarity and the current at the end of the time period 181. An added pulse in reverse polarity is configured in the time period 185 (e.g., 15 nanosecond) that is within the residual poling period of the initial voltage pulse applied in the time period 183. The added pulse in reverse polarity can move the distribution 151 to the distribution 153 in the positive polarity and the corresponding distribution 152 in the negative polarity to the distribution 154. The added voltage pulse applied in the time period 185 in FIG. 10 is such that the memory cell 101 remains non-conductive during the time period 185. The move of the distributions 151 and 152 to the distributions 153 and 154 is determined primarily by the duration of the time period 185 and the termination current passing through the memory cell 101 at the end of the time period 183.

The wordline voltage 173 and the bitline voltage 174 shown in FIG. 12 have an initial time period 183 that is configured in a way similar to the voltages 171 and 172 of FIG. 11 in polarity and the current at the end of the time period 181. An added pulse in FIG. 12 in reverse polarity is configured in the time period 185 (e.g., 10 nanosecond) that is within the residual poling period of the initial voltage pulse applied in the time period 183. The added pulse in reverse polarity can move the distribution 155 to the distribution 157 in the positive polarity and the corresponding distribution 156 to the distribution 158 in the negative polarity. The added voltage pulse applied in the time period 185 is such that the memory cell 101 becomes conductive during the time period 185, which causes the distributions 155 and 156 in both the positive and negative polarities to move to higher magnitude regions represented by the distributions 157 and 158. Since the memory cell 101 becomes conductive during the added on pulse, the move of the distributions 151 and 152 to distributions 158 and 157 is determined primarily by the termination current passing through the memory cell 101 at the end of the time period 183 of the added pulse.

The effect of the voltage pulses applied during the time period 181 in FIGS. 9 and 11 and time period 183 in FIGS. 10 and 12 is primarily controlled by the voltage polarity and the current (e.g., 120 µA) at the end of the time period 181 or 183 but is not sensitive to the length of the time period 181 or 183. Thus, the durations of the programming pulses can be configured to have a same total length for programming using the pulses illustrated in FIGS. 9 to 12. For example, the length of time period 181 of FIG. 9 can be equal to the sum of the length of the time periods 183 and 185 of FIG. 10; the length of time period 181 of FIG. 11 can be equal to the sum of the length of the time periods 183 and 185 of FIG. 12; and/or the length of time period 181 of FIG. 9 can be equal to the length of time period 181 of FIG. 11.

In FIG. 8, the voltage regions of distributions 155 and 157 overlap in part with each other. Thus, there is the lack of a voltage window to tell apart the voltage regions of distributions 155 and 157 in the positive polarity. However, the voltage regions of the distributions 156 and 158 representing the third value (e.g., two) and the fourth value (e.g., three) are separated by a voltage window. Thus, a read voltage V3 163 can be used to determine whether the memory cell 101 is programmed to the distribution 156. Since distributions 151 and 153 can be identified using read voltage V1 161 and read voltage V2 162, the value stored by the memory cell 101 programmed to store one of the values can be classified by whether the memory cell 101 is conductive under the read voltage 161 and the read voltage 162 in the positive polarity and under the read voltage 163 in the negative polarity.

In some implementations, the threshold distribution programmed using the voltage pulse of FIG. 5 is replaced with the voltage pulse of FIG. 10 or 12 to store one of three values per memory cell.

In some implementations, one of the voltage pulses of FIGS. 10 and 12 can be replaced with the threshold distribution programmed using the voltage pulse of FIG. 5 to store one of four values per memory cell.

Figure 13:
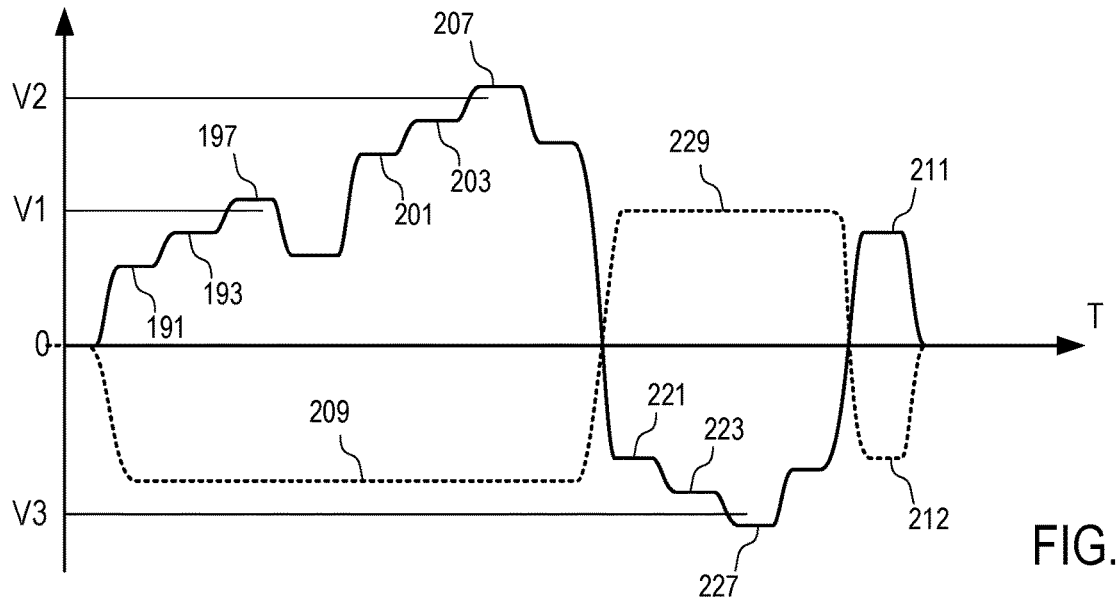
FIG. 13 illustrates voltages driven by a bitline driver and a wordline driver to read the value stored by a memory cell programmed to store one of four predetermined values according to one embodiment.

FIG. 13 illustrates voltages driven by a bitline driver and a wordline driver to read the value stored by a memory cell programmed to store one of four predetermined values according to one embodiment. For example, the technique of FIG. 13 can be used to read a memory cell programmed using one of the voltage pulses of FIGS. 9 to 12 to have distributions representative one of four values illustrated in FIG. 8.

The data stored in a group of memory cells can be encoded such that the numbers of memory cells in the group storing the individual values (e.g., zero, one, two, and three) are known at the time of reading the group of memory cells to determine which of the memory cells is storing what. The group of memory cells can be driven by a common wordline driver, or a common bitline driver for parallel operations.

Similar to the operations related to read voltage V1 and read voltage V2 in FIG. 7, while the bitline driver 147 drives the voltage level 209, incremental voltage levels 191, 193, 197 are applied one after another by a wordline driver 145, such that the count of conductive memory cells at the voltage level 197 is equal to a known percentage of the group of memory cells. Thus, the conductive memory cells at the voltage level 197 are considered to have threshold voltages in the distribution 151 and have the first value (e.g., zero).

Similarly, while the bitline driver 147 drives the voltage level 209, incremental voltage levels 201, 203, 207 are applied one after another by the wordline driver 145, such that the count of conductive memory cells at the voltage level 207 is equal to a known percentage of the group of memory cells. Thus, the conductive memory cells at the voltage level 207, but non-conductive at the voltage level 197, are considered to have threshold voltages in the distribution 153 and have the second value (e.g., one).

After the identification of the memory cells having the second value, the wordline driver 145 and the bitline driver 147 can reverse their voltages. While the bitline driver 147 drives the voltage level 229, incremental voltage levels 221, 223, 227 are applied one after another by the wordline driver 145, such that the count of conductive memory cells at the voltage level 227 is equal to a known percentage of the group of memory cells. Thus, the conductive memory cells at the voltage level 227 are considered to have threshold voltages in the distribution 156 and have the third value (e.g., two). The remaining memory cells are considered to have threshold voltages in distributions 157 and 158 and thus have the fourth value (e.g., three).

After the identifications of the values stored in the memory cells in the group, the wordline driver 145 and the bitline driver 147 can reverse their voltages again to apply a setback pulse by driving the setback levels 211 and 212 respectively. The setback pulse is configured to cancel the impact of the applied read voltage pulses used to determine the values of the memory cells in the group.

FIG. 13 illustrates an example of the wordline driver 145 stepping up voltage levels 191 to 207 and voltage levels 221 to 227 while the bitline driver 147 driving a substantially constant level 209 and then a substantially constant level 229. Alternatively, the wordline driver 145 can drive constant levels while the bitline driver 147 steps up voltage levels to count memory cells that become conductive.

Figure 14:
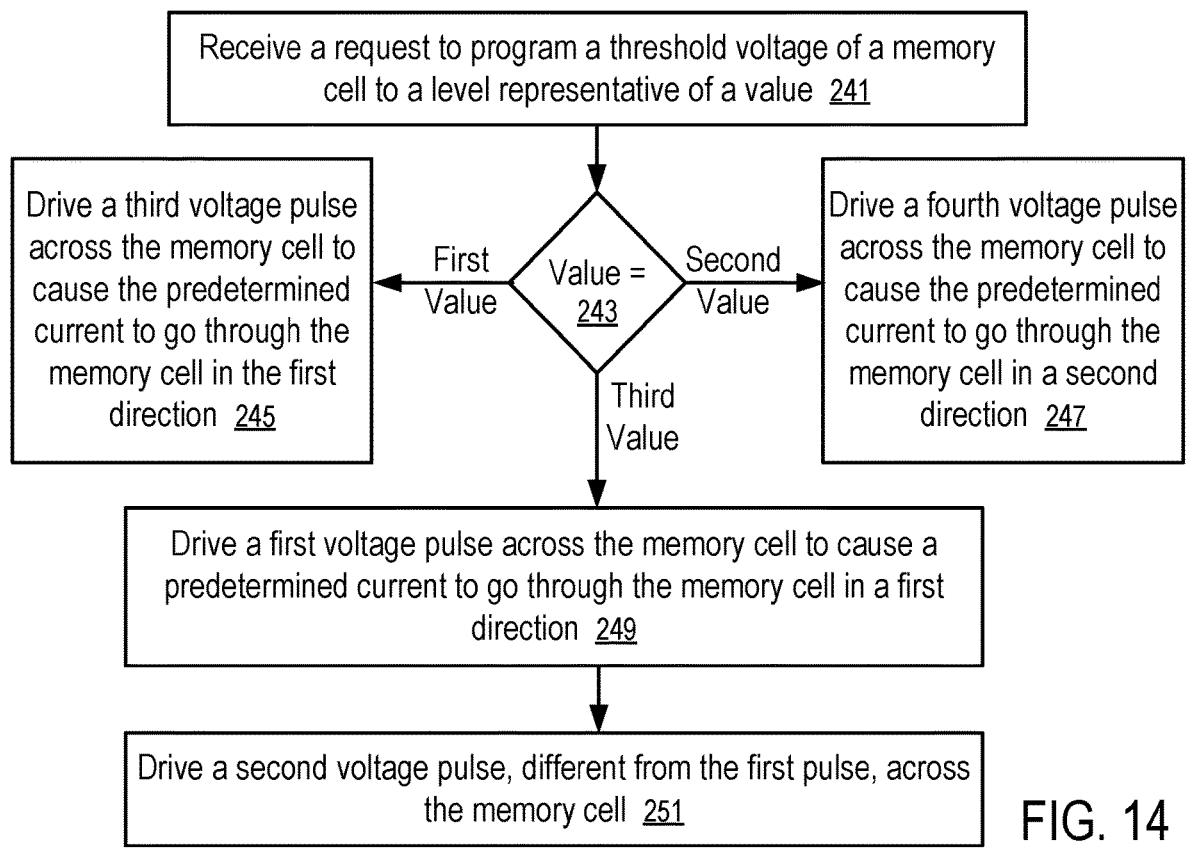
FIG. 14 shows a method to program the threshold voltage of a memory cell according to one embodiment.

FIG. 14 shows a method to program the threshold voltage of a memory cell according to one embodiment. For example, the method of FIG. 14 can be implemented in a memory device 130 of FIG. 1 having a controller 131 with a programming manager 113, as illustrated in FIGS. 1 and 2, using the threshold programming techniques discussed above in connection with FIGS. 3 to 6 and/or FIGS. 8 to 12.

At block 241, a programming manager 113 of a memory device 130 receives a request to program a threshold voltage of a memory cell 101 to a level representative of a value.

At block 243, the programming manager 113 selects operations based on the value to be stored in the memory cell 101.

If a third value is to be stored, at block 249, the programming manager 113 instructs voltage drivers of the memory cell 101 (e.g., bitline driver 147 and the wordline driver 145) to drive a first voltage pulse across the memory cell 101 to cause a predetermined current (e.g., 120 µA) to go through the memory cell 101 in a first direction. At block 251, The voltage drivers drive a second voltage pulse, different from the first pulse, across the memory cell 101.

For example, the second voltage pulse is configured within a time period of residual poling in the memory cell 101 caused by the first voltage pulse.

For example, the second voltage pulse lasts no more than 20 nanosecond; and the total duration of the first voltage pulse and the second voltage pulse lasts no more than 250 nanoseconds.

For example, the duration of the second voltage pulse is no more than one tenth of the total duration of the first voltage pulse and the second voltage pulse and/or no more than one tenth of the duration of the first voltage pulse.

In contrast, if a first value is to be stored in the memory cell 101, at block 245, the programming manager 113 instructs the voltage drivers to drive a third voltage pulse across the memory cell 101 to cause the predetermined current (e.g., 120 µA) to go through the memory cell 101 in the first direction. If a second value is to be stored in the memory cell 101, at block 247, the programming manager 113 instructs the voltage drivers to drive a fourth voltage pulse across the memory cell 101 to cause the predetermined current (e.g., 120 µA) to go through the memory cell in a second direction opposite to the first direction.

For example, the total duration of the first voltage pulse and the second voltage pulse is equal to the duration of the third voltage pulse and/or the duration of the fourth voltage pulse.

For example, in absence of the second voltage pulse, the first voltage pulse is sufficient to program the memory cell 101 to store the first value.

For example, if a fourth value is to be stored in the memory cell 101, the programming manager 113 instructs the voltage drivers to drive a fifth voltage pulse across the memory cell 101 to cause the predetermined current to go through the memory cell in the second direction and then drive a sixth voltage pulse, different from the fifth voltage pulse and within a time period of residual poling in the memory cell caused by the fifth voltage pulse. across the memory cell 101. The total duration of the fifth voltage pulse and the sixth voltage pulse can be equal to the duration of the fourth voltage pulse and/or the duration of the third voltage pulse.

The first voltage pulse and the third voltage pulse have a same first polarity to cause the memory cell 101 to be conductive and cause the predetermined current to go through the memory cell 101 in the first direction.

The fifth voltage pulse and the fourth voltage pulse have a same second polarity, opposite to the first polarity, to cause the memory cell 101 to be conductive and cause the predetermined current to go through the memory cell 101 in the second direction opposite to the first direction.

In some implementations, the second voltage pulse and the first voltage pulse have opposite polarities; and the sixth voltage pulse and the fifth voltage pulses have opposite polarities, as illustrated in FIGS. 10 and 12.

For example, the second voltage pulse is insufficient to place the memory cell 101 in a conductive state; and the sixth voltage pulse is sufficient to place the memory cell in a conductive state.

In some implementations, the second voltage pulse and the first voltage pulse have the same polarities, as illustrated in FIG. 5.

For example, the first voltage pulse and the second voltage pulse can be formed via the voltage drivers (e.g., bitline driver 141 and wordline driver 145) of the memory cell 101 driving voltage levels of different polarities and for different periods of different lengths. A first voltage driver of the memory cell 101 drives a first voltage level on to a first side of the memory cell 101 (e.g., connected to the bitline 141 or the wordline 143) relative to ground for a first period of time (e.g., time periods 183 and 185 in FIG. 5); and a second voltage driver drives a second voltage level on to a second side (e.g., connected to the wordline 143 or the bitline 141) of the memory cell 101 relative to the ground for a second period of time (e.g., time period 185 in FIG. 5). The first period of time includes the second period of time; and the first voltage level and the second voltage level have different polarities relative to the ground. The memory cell 101 is conductive within the second period of time and non-conductive in a portion of the first period of time following the second period of time. During a portion (e.g., time period 185 in FIG. 5) of the first period of time that follows the second period of time (e.g., time period 183 in FIG. 5), the second voltage driver connects the ground to the second side of the memory cell 101; and the memory cell 101 is non-conductive during the portion of the first period of time. A difference (e.g., time period 183 in FIG. 5) between the first period of time and the second period of time is no more than one tenth of a during of the first period of time. To store the first value in the memory cell 101, the second period of time can be extended to have the same length as the first period of time.

Figure 15:
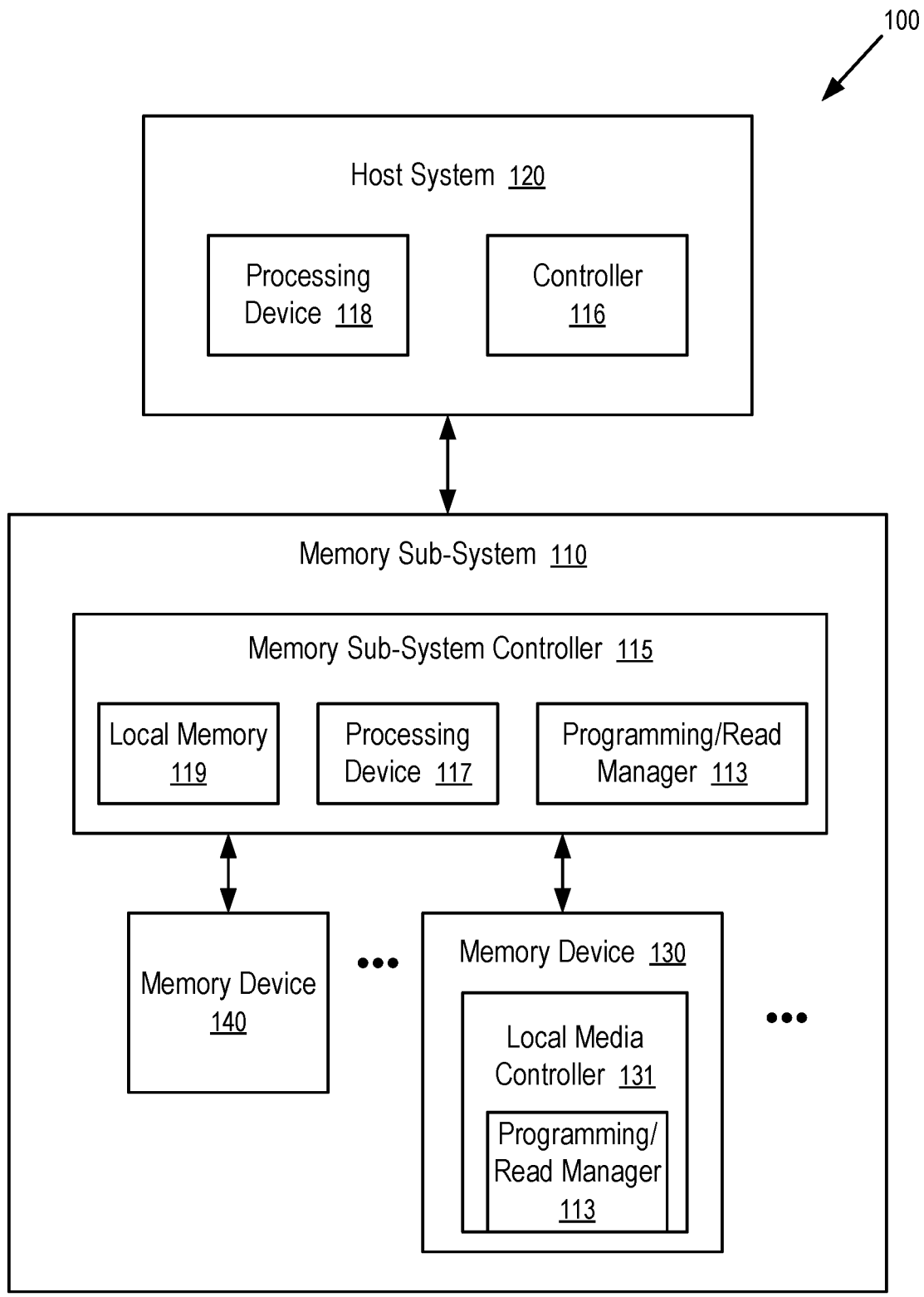
FIG. 15 illustrates an example computing system having a memory sub-system in accordance with some embodiments of the present disclosure.

FIG. 15 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130 of FIG. 1), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or such a computing device that includes memory and a processing device.

The computing system 100 can include a host system 120 that is coupled to one or more memory sub-systems 110. FIG. 15 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset (e.g., processing device 118) and a software stack executed by the processor chipset. The processor chipset can include one or more cores, one or more caches, a memory controller (e.g., controller 116) (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, a universal serial bus (USB) interface, a Fibre Channel, a Serial Attached SCSI (SAS) interface, a double data rate (DDR) memory bus interface, a Small Computer System Interface (SCSI), a dual in-line memory module (DIMM) interface (e.g., DIMM socket interface that supports Double Data Rate (DDR)), an Open NAND Flash Interface (ONFI), a Double Data Rate (DDR) interface, a Low Power Double Data Rate (LPDDR) interface, or any other interface. The physical host interface can be used to transmit data between the host system 120 and the memory sub-system 110. The host system 120 can further utilize an NVM Express (NVMe) interface to access components (e.g., memory devices 130 of FIG. 1) when the memory sub-system 110 is coupled with the host system 120 by the PCIe interface. The physical host interface can provide an interface for passing control, address, data, and other signals between the memory sub-system 110 and the host system 120. FIG. 15 illustrates a memory sub-system 110 as an example. In general, the host system 120 can access multiple memory sub-systems via a same communication connection, multiple separate communication connections, and/or a combination of communication connections.

The processing device 118 of the host system 120 can be, for example, a microprocessor, a central processing unit (CPU), a processing core of a processor, an execution unit, etc. In some instances, the controller 116 can be referred to as a memory controller, a memory management unit, and/or an initiator. In one example, the controller 116 controls the communications over a bus coupled between the host system 120 and the memory sub-system 110. In general, the controller 116 can send commands or requests to the memory sub-system 110 for desired access to memory devices 130, 140. The controller 116 can further include interface circuitry to communicate with the memory sub-system 110. The interface circuitry can convert responses received from the memory sub-system 110 into information for the host system 120.

The controller 116 of the host system 120 can communicate with the controller 115 of the memory sub-system 110 to perform operations such as reading data, writing data, or erasing data at the memory devices 130, 140 and other such operations. In some instances, the controller 116 is integrated within the same package of the processing device 118. In other instances, the controller 116 is separate from the package of the processing device 118. The controller 116 and/or the processing device 118 can include hardware such as one or more integrated circuits (ICs) and/or discrete components, a buffer memory, a cache memory, or a combination thereof. The controller 116 and/or the processing device 118 can be a microcontroller, special purpose logic circuitry (e.g., a field programmable gate array (FPGA), an application specific integrated circuit (ASIC), etc.), or another suitable processor.

The memory devices 130, 140 can include any combination of the different types of non-volatile memory components and/or volatile memory components. The volatile memory devices (e.g., memory device 140) can be, but are not limited to, random access memory (RAM), such as dynamic random access memory (DRAM) and synchronous dynamic random access memory (SDRAM).

Some examples of non-volatile memory components include a negative-and (or, NOT AND) (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs, or any combination of such. In some embodiments, a particular memory device can include an SLC portion, an MLC portion, a TLC portion, a QLC portion, and/or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point type and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations (e.g., in response to commands scheduled on a command bus by controller 116). The controller 115 can include hardware such as one or more integrated circuits (ICs) and/or discrete components, a buffer memory, or a combination thereof. The hardware can include digital circuitry with dedicated (e.g., hard-coded) logic to perform the operations described herein. The controller 115 can be a microcontroller, special purpose logic circuitry (e.g., a field programmable gate array (FPGA), an application specific integrated circuit (ASIC), etc.), or another suitable processor.

The controller 115 can include a processing device 117 (e.g., processor) configured to execute instructions stored in a local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 15 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory devices 130. The controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 131 that operate in conjunction with the memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local media controller 131) for media management within the same memory device package. An example of a managed memory device is a managed NAND (MNAND) device.

The controller 115 and/or a memory device 130 can include a programming/read manager 113, such as the programming manager 113 discussed above in connection with FIGS. 1 to 6, and FIGS. 8 to 12, and FIG. 14, and a read manager to perform operations discussed above in connection with FIGS. 7 and 13. In some embodiments, the controller 115 in the memory sub-system 110 includes at least a portion of the programming/read manager 113. In other embodiments, or in combination, the controller 116 and/or the processing device 118 in the host system 120 includes at least a portion of the programming/read manager 113. For example, the controller 115, the controller 116, and/or the processing device 118 can include logic circuitry implementing the programming/read manager 113. For example, the controller 115, or the processing device 118 (e.g., processor) of the host system 120, can be configured to execute instructions stored in memory for performing the operations of the programming/read manager 113 described herein. In some embodiments, the programming/read manager 113 is implemented in an integrated circuit chip (e.g., memory device 130) installed in the memory sub-system 110. In other embodiments, the programming/read manager 113 can be part of firmware of the memory sub-system 110, an operating system of the host system 120, a device driver, or an application, or any combination therein.

Figure 16:
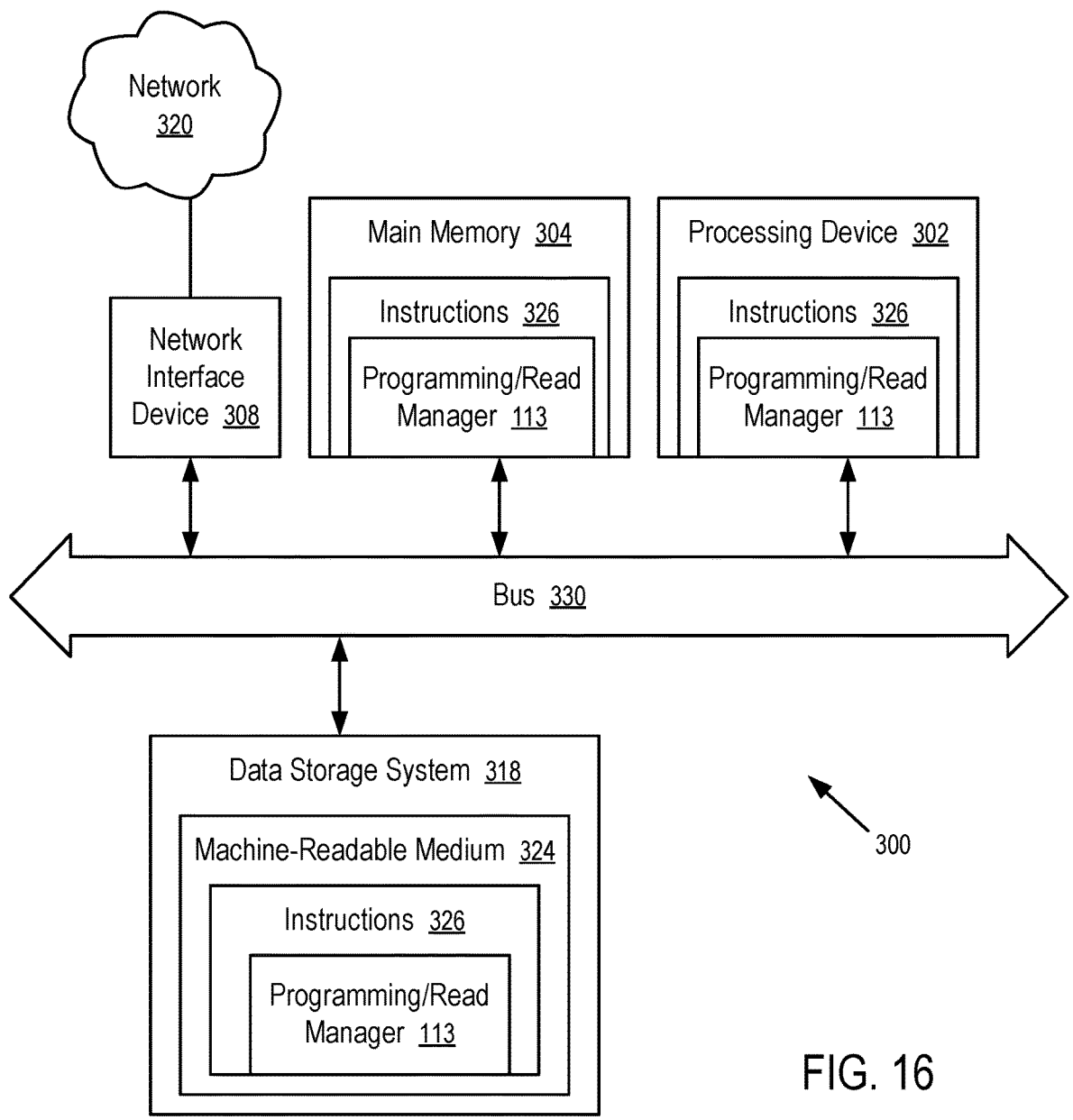
FIG. 16 is a block diagram of an example computer system in which embodiments of the present disclosure can operate.

FIG. 16 illustrates an example machine of a computer system 300 within which a set of instructions, for causing the machine to perform any one or more of the methodologies discussed herein, can be executed. In some embodiments, the computer system 300 can correspond to a host system (e.g., the host system 120 of FIG. 15) that includes, is coupled to, or utilizes a memory sub-system (e.g., the memory sub-system 110 of FIG. 15) or can be used to perform the operations of a programming/read manager 113 (e.g., to execute instructions to perform operations corresponding to the programming/read manager 113 described with reference to FIGS. 1-15). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 300 includes a processing device 302, a main memory 304 (e.g., read-only memory (ROM), flash memory, dynamic random access memory (DRAM) such as synchronous DRAM (SDRAM) or Rambus DRAM (RDRAM), static random access memory (SRAM), etc.), and a data storage system 318, which communicate with each other via a bus 330 (which can include multiple buses).

Processing device 302 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 302 can also be one or more special-purpose processing devices such as an application specific integrated circuit (ASIC), a field programmable gate array (FPGA), a digital signal processor (DSP), network processor, or the like. The processing device 302 is configured to execute instructions 326 for performing the operations and steps discussed herein. The computer system 300 can further include a network interface device 308 to communicate over the network 320.

The data storage system 318 can include a machine-readable medium 324 (also known as a computer-readable medium) on which is stored one or more sets of instructions 326 or software embodying any one or more of the methodologies or functions described herein. The instructions 326 can also reside, completely or at least partially, within the main memory 304 and/or within the processing device 302 during execution thereof by the computer system 300, the main memory 304 and the processing device 302 also constituting machine-readable storage media. The machine-readable medium 324, data storage system 318, and/or main memory 304 can correspond to the memory sub-system 110 of FIG. 15.

In one embodiment, the instructions 326 include instructions to implement functionality corresponding to a programming/read manager 113 (e.g., the programming/read manager 113 described with reference to FIGS. 1-15). While the machine-readable medium 324 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In this description, various functions and operations are described as being performed by or caused by computer instructions to simplify description. However, those skilled in the art will recognize what is meant by such expressions is that the functions result from execution of the computer instructions by one or more controllers or processors, such as a microprocessor. Alternatively, or in combination, the functions and operations can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A device, comprising:
   memory cells;
   voltage drivers connected to the memory cells; and
   a controller coupled to the voltage drivers;
   wherein, in response to a determination to program a threshold voltage of a memory cell to a level representative of a value, the controller is configured to instruct the voltage drivers to:
      drive a first voltage pulse across the memory cell to cause a predetermined current to go through the memory cell; and
      drive a second voltage pulse, different from the first voltage pulse and within a time period that is no more than one tenth of a duration of the first voltage pulse, across the memory cell.

2. The device of claim 1, wherein in absence of the second voltage pulse, application of the first voltage pulse to the memory cell programs the threshold voltage of the memory cell to an alternative level representative of an alternative value.

3. The device of claim 2, wherein the second voltage pulse lasts no more than 20 nanoseconds.

4. The device of claim 3, wherein a duration of the first voltage pulse and the second voltage pulse lasts no more than 250 nanoseconds.

5. The device of claim 1, wherein the value is a third value;
wherein in response to the determination to program the threshold voltage of the memory cell to represent a first value, the controller is configured to instruct the voltage drivers to drive a third voltage pulse across the memory cell to cause the predetermined current to go through the memory cell in a same first direction as the predetermined current caused by the first voltage pulse; and
wherein in response to the determination to program the threshold voltage of the memory cell to represent a second value, the controller is configured to instruct the voltage drivers to drive a fourth voltage pulse across the memory cell to cause the predetermined current to go through the memory cell in a second direction, opposite to the first direction.

6. The device of claim 5, wherein in response to a determination to program the threshold voltage of the memory cell to represent a fourth value, the controller is configured to instruct the voltage drivers to:
drive a fifth voltage pulse across the memory cell to cause the predetermined current to go through the memory cell in the second direction; and
drive a sixth voltage pulse, different from the fifth voltage pulse and within a time period that is no more than one tenth of a duration of the fifth voltage pulse, across the memory cell.

7. The device of claim 6, wherein a duration of the first voltage pulse and the second voltage pulse has a same length as a duration of the third voltage pulse; and a duration of the fifth voltage pulse and the sixth voltage pulse has a same length as a duration of the fourth voltage pulse.

8. The device of claim 7, wherein the duration of the third voltage pulse and the duration of the fourth voltage pulse have a same length.

9. The device of claim 8, wherein the second voltage pulse and the fifth voltage pulse have a same first polarity; and the first voltage pulse and the sixth voltage pulse have a same second polarity, opposite to the first polarity.

10. The device of claim 9, wherein the second voltage pulse is insufficient to place the memory cell in a conductive state; and the sixth voltage pulse is sufficient to place the memory cell in a conductive state.

11. The device of claim 5, wherein the first voltage pulse and the third voltage pulse have a same first polarity; and the second voltage pulse and the fourth voltage pulse have a same second polarity, opposite to the first polarity.

12. The device of claim 5, wherein the first voltage pulse, the second voltage, and the third voltage pulse have a same polarity, different from a polarity of the fourth voltage pulse.

13. A method, comprising:
receiving a first request to program a threshold voltage of a memory cell to a level representative of a third value different from a first value and a second value; and
in response to the first request,
driving a first voltage pulse across the memory cell to cause a predetermined current to go through the memory cell; and
driving a second voltage pulse, different from the first voltage pulse, across the memory cell, wherein a duration of the second voltage pulse is no more than one tenth of a duration of the first voltage pulse.

14. The method of claim 13, further comprising:
receiving a second request to program a threshold voltage of the memory cell to a level representative of the first value; and
in response to the second request,
driving a third voltage pulse across the memory cell to cause the predetermined current to go through the memory cell in a same first direction as the first voltage pulse;
wherein a duration of the first voltage pulse and the second voltage pulse and a duration of the third voltage pulse have a same length.

15. The method of claim 14, further comprising:
receiving a third request to program a threshold voltage of the memory cell to a level representative of the second value; and
in response to the third request,
driving a fourth voltage pulse across the memory cell to cause the predetermined current to go through the memory cell in a second direction opposite to the first direction.

16. The method of claim 15, wherein the first voltage pulse and the second voltage pulse have a same polarity.

17. The method of claim 16, wherein the first voltage pulse and the second voltage pulse have opposite polarities.

18. An integrated circuit, comprising:
a layer of bitlines;
a layer of wordlines;
memory cells configured between the layer of the bitlines and the layer of the wordlines, each of the memory cells connected to a bitline among the bitlines and to a wordline among the wordlines;
bitline drivers connected to the bitlines;
wordline drivers connected to the wordlines; and
a controller coupled to the bitline drivers and the wordline drivers and configured to, in response to a request to program a threshold voltage of a first memory cell, among the memory cells, to a level representative of a third value different from a first value and a second value,
instruct a first voltage driver, among the bitline drivers and the wordline drivers, to drive a first voltage level onto a first side of the memory cell relative to ground for a first period of time; and
instruct a second voltage driver, among the bitline drivers and the wordline drivers, to drive a second voltage level onto a second side of the memory cell relative to the ground for a second period of time, wherein:
the first period of time includes the second period of time;
the first voltage level and the second voltage level have different polarities relative to the ground; and
a difference between the first period of time and the second period of time is no more than one tenth of a during of the first period of time.

19. The integrated circuit of claim 18, wherein the memory cell is conductive within the second period of time and non-conductive in a portion of the first period of time following the second period of time.

\* \* \* \* \*